United States Patent [19]

Hayashi

[11] Patent Number: 4,747,421

[45] Date of Patent: May 31, 1988

[54] APPARATUS FOR REMOVING COVERING FILM

[75] Inventor: Chikara Hayashi, Chigasaki, Japan

[73] Assignees: Research Development Corporation of Japan, Chiba; Vacuum Metallurgical Co., Ltd., Tokyo, both of Japan

[21] Appl. No.: 881,073

[22] Filed: Jul. 2, 1986

Related U.S. Application Data

[62] Division of Ser. No. 711,475, Mar. 13, 1985, Pat. No. 4,631,250.

[51] Int. Cl.$^4$ .............................................. B08B 11/00
[52] U.S. Cl. ...................................... 134/201; 134/7; 134/102
[58] Field of Search .................... 134/7, 93, 102, 201; 51/319, 320, 410; 15/320

[56] References Cited

U.S. PATENT DOCUMENTS

| | | | |
|---|---|---|---|
| 3,074,822 | 1/1963 | Walk et al. | 134/7 |
| 3,089,775 | 5/1963 | Lindall | 51/320 UX |
| 3,545,996 | 12/1970 | Duncan | 51/319 X |
| 3,611,639 | 10/1971 | Ashworth | 51/319 X |
| 3,676,963 | 7/1972 | Rice et al. | 51/320 |
| 3,702,519 | 11/1972 | Rice et al. | 51/320 |
| 4,038,786 | 8/1972 | Fong | 51/320 |
| 4,389,820 | 6/1983 | Fong et al. | 51/320 |

Primary Examiner—Harvey C. Hornsby
Assistant Examiner—Frankie L. Stinson
Attorney, Agent, or Firm—Abelman Frayne Rezac & Schwab

[57] ABSTRACT

An apparatus for removing a photo-resist covering from a substrate employs fine solid $CO_2$ particles that are impacted on the substrate at high velocity to cause abrading of the photo-resist covering in the absence of damage or contamination of the substrate.

8 Claims, 1 Drawing Sheet

APPARATUS FOR REMOVING COVERING FILM

This is a division of application Ser. No. 711,475 filed Mar. 13, 1985 and now U.S. Pat. No. 4,631,250.

FIELD OF THE INVENTION

This invention relates to an apparatus for removing a photoresist covering film or the like subsequent to a photoetching process or the like in the semi-conductor industrial field or the like.

BACKGROUND OF THE INVENTION

Photoresist film covering a surface of a substrate becomes unnecessary after effecting a photoetching treatment in the semi-conductor manufacturing industry. Processes are well known, in which, for instance (i) the covering film is oxidized by a heated mixture liquid of bichromate and sulfuric acid, or (ii) the covering film is heated to a high temperature under an oxygen gas current atmosphere in order to be burned, or (iii) the covering film is peeled off after the same is swelled by being immersed in a high temperature peeling agent, or (iv) the covering film is oxidized by heating caused by a glow discharge of high frequency under a low pressure oxygen gas current atmosphere.

These known processes, however, are inconvenient in that they result in the contamination of the surface of the substrate, or in the adhesion of impurities thereto, or in damage or deterioration thereof by the oxidizing liquid or the peeling agent, or by the heating, oxidation, burning and charring of the photoresist film. Thus manufacturing losses resulting from defective products cannot be avoided.

SUMMARY OF THE INVENTION

This invention has for its objects to provide an apparatus for removing a photoresist film which avoids all of the disadvantages of the foregoing conventional processes and which is operative to remove a covering film such as a photoresist film or the like without causing adherence to the substrate of any contaminants and without causing damage and deterioration of the substrate caused by the heating and others steps of the known processes, and it is characterized in that fine solid $CO_2$ particles are blown against the photoresist covering film applied to the surface of the substrate.

The present invention relates to an apparatus for use in removing a photoresist covering film characterized in that fine solid $CO_2$ particles are impacted against a photoresist covering film applied to a surface of a substrate.

The fine solid $CO_2$ particles which are used can be in such a condition that fine ice particles are mixed therewith.

The apparatus has a micronizing jet nozzle connected directly through a connecting pipe to a bomb containing liquefied carbonic acid gas, and which is arranged to direct solid particles of $CO_2$ toward a substrate having thereon a photoresist covering film to be removed therefrom.

A preferred apparatus according to process of the present invention comprises a hermetically sealed chamber for forming fine $CO_2$ particles. The chamber is provided on its rear side wall with a $CO_2$ gas-introducing pipe and an $N_2$ gas-introducing pipe, and on its front side wall is provided with a jet nozzle extending into a treatment chamber in which a substrate having a photoresist covering film is to be positioned.

The apparatus may also incorporate an $N_2$ gas-introducing pipe for accelerating the velocity of $CO_2$ particles exiting the jet nozzle, and which is connected to a side surface of the jet nozzle.

In a further embodiment, the treatment chamber is connected to a vacuum evacuation system.

One embodying example of use of the apparatus will now be explained as applied to a photoetching treatment in the semi-conductor manufacturing industry.

A substrate comprising, for instance, a silicon plate is covered with photoresist coating film. After the photoresist coating film is applied, the solvent thereof is removed by pre-baking. The resultant dried photoresist coating film is then exposed to light through a photo mask, whereby a predetermined photoresist image pattern is formed thereon. Thereafter, the exposed region of the photoresist film is developed by a spray process, or a dipping process or the like, and the unexposed region thereof is removed by a solvent. Thereafter, the adhesion property of the exposed photoresist image to the substrate, and the corrosion resistance property of the photoresist image itself is improved by baking. Thereafter, the substrate is immersed in an etching liquid for removing regions not covered by the photoresist image, whereby there is produced the etched substrate having a predetermined patterned surface. At this stage, the photoresist film has become unnecessary and must be removed.

The conventional removing processes discussed above are not employed. Instead, $CO_2$ gas is directed in a jet toward the photoresist surface on the substrate by means of a micronsized jet nozzle connected to a bomb containing liquefied carbonic acid. Micronized $CO_2$ particles in a solid state are formed due to free expansion of the jetted gas, and those solid particles are directed against the photoresist on the substrate to remove the same by abrasion. Because the particles are solid particles of $CO_2$, there is no fear of contamination the substrate surface with the same, in that those particles become gasified immediately after impacting against the substrate, and, no $CO_2$ particles remain on the substrate surface as adhered matter, thus resulting in the production of a clean substrate.

DESCRIPTION OF THE PREFERRED EMBODIMENTS

Figure 1:
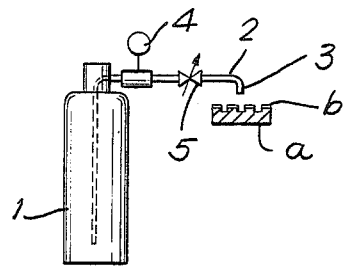
FIG. 1 shows one example of an apparatus of this invention process.

Referring to FIG. 1, numeral 1 denotes a liquefied carbonic acid bomb, numeral 2 denotes a connecting pipe 2 led outwards therefrom, numeral 3 denotes a jetting nozzle of 1 mm in inner diameter connected to a forward end of the connecting pipe 2, numeral 4 denotes a flow meter interposed in the connecting pipe 2, and numeral 5 denotes a flow rate adjusting valve.

The resulting solid $CO_2$ particles formed by the foregoing members 1–5 is used as follows. A substrate a after subjection to the etching treatment is placed in front of the nozzle 3. Liquified carbonic acid is blown out through the nozzle 3 toward a resist film b of 0.4 micron in thickness remaining on the surface of the substrate a. The direction of the nozzle 3 is kept at a right angle to the substrate or at an angle inclined in relation thereto. Fine solid $CO_2$ particles result from the liquefied $CO_2$ being solidified by rapid cooling due to the free expansion thereof. The resultant $CO_2$ particles are impacted against the film in an amount of 30 grams or so, for instance, whereby the resist film b is removed from the substrate by an abrasion. The $CO_2$ particles become gasified immediately after striking the substrate. Thus, there are no $CO_2$ particles left behind on the surface of the substrate a, and thus the complete removal of the photoresist covering film b is achieved in the absence of any contamination of the substrate a.

It has been determined that the abrading effect of the $CO_2$ particles at an angle of 45 degrees of the nozzle in relation to the substrate is 10 times greater than the abrading effect at a right angle of the nozzle relative to the substrate when equal amounts of $CO_2$ particles are blown against the substrate.

Figure 2:
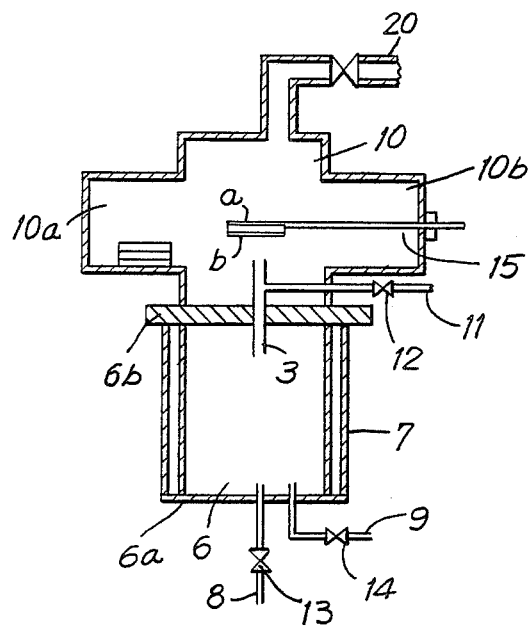
FIG. 2 shows an alternative example.

FIG. 2 shows a modified apparatus of this invention, in which the photoresist film coating film is removed by an accelerated velocity of the solid $CO_2$ particles.

Referring to FIG. 2, numeral 6 denotes a hermetically sealed chamber for forming solid $CO_2$ particles which has a jacket type peripheral wall 7 through which a flow of liquefied nitrogen is provided. A rear wall 6a of the sealed chamber 6 is provided with $CO_2$ gas introducing pipe 8, and, a $N_2$ gas introducing pipe 9 for forming the $CO_2$ particles.

A front wall 6b thereof is provided with a jet nozzle 3 extending into a treatment chamber 10 positioned in front thereof. The $CO_2$ gas introduced into the sealed chamber 6 through the pipe 8 is cooled and solidified by the liquefied nitrogen, and as a result innumerable fine solid $CO_2$ particles are produced in the sealed chamber 6. At the same time, the resultant fine solid $CO_2$ particles are supplied to the nozzle 3, while at the same time being agitated and carried forward at high velocity by the $N_2$ gas introduced into the chamber 6. Thus, the solid $CO_2$ particles are ejected in a high velocity jet from the jetting nozzle 3.

For accelerating the jetting flow of the fine solid $CO_2$ particles, nitrogen gas is introduced through pipe 11 connected to a side surface portion of the nozzle 3. Numeral 12 denotes an adjusting valve interposed in the pipe 11, numeral 13 denotes an adjusting valve interposed in the $CO_2$ as introducing pipe 8, and numeral 14 denotes an adjusting valve interposed in the carrying $N_2$ gas introducing pipe 9.

The treatment chamber 10 is connected to a vacuum evacuation system (not illustrated) so that gases and debris in the chamber 10 may be sucked out through discharge conduit 11. An operation rod 15 is inserted air-tightly through one side wall of the chamber 10 so as to be movable to advance and retreat, and a substrate a is held by a forward end portion thereof and is located in front of the nozzle 3 so that a treatment for removing a photoresist covering film b of the substrate a may be carried out.

A recessed chamber 10a, on the left side in this Figure is used as a stock chamber for stocking substrates a stacked in layers to be treated one after another, and a recessed chamber 10b on the right side is used to serve as a stock chamber for stocking the substrates a after treatment.

An embodying example of the process using the apparatus of this invention is as follows:

$CO_2$ gas is introduced into the $CO_2$ particle forming chamber 6 through the $CO_2$ gas introducing pipe 8 at a flow rate of 0.3. NTP/min. (30 g/min), while $N_2$ gas is introduced thereinto through the carrying $N_2$ gas introducing pipe 9 at a flow rate of 1 /min. As a result thereof, the $CO_2$ gas introduced in the chamber 6 is rapidly cooled and solidified by the liquefied nitrogen gas so that innumerable fine solid $CO_2$ particles are produced. A mass of these particles is supplied to the nozzle 3 by the $N_2$ gas, while being agitated by the $N_2$ gas. The flow of the $CO_2$ particles supplied in the nozzle 3 is accelerated by the accelerating $N_2$ gas flow in the nozzle 3 through the accelerating $N_2$ gas introducing pipe 11 at a flow rate of 20 /min. Thereby the $CO_2$ particles are sent out in a high velocity vigorously from the forward end of the nozzle 3 and are impacted against the substrate a set in front thereof. Thereby the photoresist covering film b on the front surface of the substrate a is abraded and removed therefrom. Abraded particles of the removed covering film are carried away from the chamber 10 by the suction of the vacuum system. Thus, a photoresist covering film removing operation is effected under clean conditions and at high efficiency.

The apparatus of this invention process is not limited to the removal of photoresist film, but also can be used in removing any other kind of film, such as a covering film of nitrogen oxide or any other oxide, or organic high molecular film or the like.

In a modified example of this invention, fine particles of $H_2O$ ice are used together with the $CO_2$ particles in such a condition that a proper amount thereof is mixed therewith.

The grain size of the $CO_2$ particles may be properly selected, but it is preferable to use especially super fine particles of below 0.1 micron at the final removal stage, i.e., when the covering film has been made so thin that the surface of the substrate is about to be revealed due to the blasting of solid $CO_2$ particles thereagainst.

Thus, according to this invention, a photoresist covering film on a substrate is removed by an apparatus in which solid $CO_2$ particles are impacted thereagainst, so that the uncovered surface of the substrate can be obtained entirely free from any contamination and in addition, because the particles become gasified after impaction, there is no fear that particles remain on the surface of the substrate as in a conventional sand blasting operation useful for treatment of a fine or intricate surface.

I claim:

1. An apparatus for removing a photo resist covering film by blowing fine solid $CO_2$ particles against a covering film applied to a surface of a substrate, including a jet nozzle directly connected through a connecting pipe to a bomb containing liquefied carbonic acid gas and arranged to be directed toward a substrate having thereon a photo resist covering film to be removed, said jet nozzle providing for the conversion of said liquified carbonic acid gas into a high velocity stream of said fine solid $CO_2$ particles.

2. An apparatus according to claim 1, wherein an air-tight sealed precooling chamber for forming solid $CO_2$ particles is provided, on a rear side wall of the sealed chamber, with a $CO_2$ gas-introducing pipe and an $N_2$ gas-introducing pipe, and is provided, on a front wall of the sealed chamber, with a jet nozzle extending into a vacuum treatment chamber containing a substrate with a covering film to be treated.

3. An apparatus as claimed in claim 2, wherein an $N_2$ gas-introducing pipe for accelerating the flow speed of $CO_2$ particles is connected to a side surface of the jet nozzle.

4. An apparatus as claimed in claim 2, wherein the treatment chamber is connected to a vacuum evacuation system.

5. An apparatus for removing a photo resist covering film by blowing fine solid $CO_2$ particles mixed with fine ice particles against a covering film applied to a surface of a substrate, including a jet nozzle which is directly connected through a connecting pipe to a bomb containing liquefied carbonic acid gas and arranged to be directed toward a substrate having thereon a photo resist covering film to be removed, said jet nozzle providing for the conversion of said liquefied carbonic acid gas into a high velocity stream of said fine $CO_2$ particles for subsequent admixture with said fine ice particles.

6. An apparatus according to claim 5, wherein an air-tight sealed chamber for forming $CO_2$ particles is provided on a rear side wall of the sealed chamber, with a $CO_2$ gas-introducing pipe and an $N_2$ gas-introducing pipe, and is provided, on a front wall of the sealed chamber, with a jet nozzle extending into a treatment chamber containing a substrate with a covering film to be treated.

7. An apparatus as claimed in claim 6, wherein an $N_2$ gas-introducing pipe for accelerating the flow speed of $CO_2$ particles is connected to a side surface of the jet nozzle.

8. An apparatus as claimed in claim 6, wherein the treatment chamber is connected to a vacuum evacuation system.

* * * * *